US012701809B2

(12) United States Patent
Choi

(10) Patent No.: US 12,701,809 B2
(45) Date of Patent: Aug. 4, 2026

(54) SEMICONDUCTOR PACKAGE INCLUDING MULTIPLE SEMICONDUCTOR CHIPS

(71) Applicant: SAMSUNG ELECTRONICS CO., LTD., Suwon-si (KR)

(72) Inventor: Ikjun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 18/458,991

(22) Filed: Aug. 30, 2023

(65) Prior Publication Data

US 2025/0081654 A1     Mar. 6, 2025

(30) Foreign Application Priority Data

Jan. 13, 2023     (KR) ........................ 10-2023-0005719

(51) Int. Cl.
  *H10F 39/00* (2025.01)
  *H10W 20/20* (2026.01)
  *H10W 20/42* (2026.01)
  *H10W 20/43* (2026.01)

(52) U.S. Cl.
  CPC ......... *H10F 39/809* (2025.01); *H10F 39/804* (2025.01); *H10W 20/20* (2026.01); *H10W 20/42* (2026.01); *H10W 20/43* (2026.01)

(58) Field of Classification Search
  CPC .... H10F 39/809; H10F 39/804; H10W 20/20; H10W 20/42; H10W 20/43
  See application file for complete search history.

(56) References Cited

U.S. PATENT DOCUMENTS

| | | | | |
|---|---|---|---|---|
| 7,180,149 | B2 * | 2/2007 | Yamamoto | H10W 72/0198 257/434 |
| 8,697,473 | B2 * | 4/2014 | Borthakur | H10F 39/026 438/66 |
| 8,823,179 | B2 * | 9/2014 | Tsai | H10W 20/20 257/774 |
| 8,872,196 | B2 * | 10/2014 | Lee | H10F 55/00 257/82 |

(Continued)

FOREIGN PATENT DOCUMENTS

| | | | | |
|---|---|---|---|---|
| CN | 101226949 | A * | 7/2008 | |
| CN | 103077951 | A * | 5/2013 | ............ H10F 39/811 |

(Continued)

*Primary Examiner* — Laura M Menz
(74) *Attorney, Agent, or Firm* — Morgan, Lewis & Bockius LLP

(57) ABSTRACT

A semiconductor package includes a semiconductor chip structure and a transparent substrate. The semiconductor chip structure includes first and second semiconductor chips. The first semiconductor chip includes a semiconductor substrate including first and second surfaces, a wiring layer, and a through electrode. The first semiconductor chip has a step structure on an edge of the semiconductor chip structure and connected to the second surface. The step structure includes first to fourth steps. The first step includes a first bottom surface and a first lateral surface. The second step includes a second bottom surface and a second lateral surface. The third step includes a third bottom surface and a third lateral surface. The through electrode extends from the second bottom surface toward the wiring layer.

15 Claims, 15 Drawing Sheets

(56) References Cited

U.S. PATENT DOCUMENTS

| | | | | |
|---|---|---|---|---|
| 9,136,293 | B2 * | 9/2015 | Yee | H10F 39/026 |
| 9,153,557 | B2 * | 10/2015 | Sung | H10W 70/09 |
| 9,163,657 | B2 | 10/2015 | Sung et al. | |
| 9,640,580 | B2 * | 5/2017 | Lee | H10F 39/811 |
| 9,853,079 | B2 * | 12/2017 | Oganesian | H10F 39/026 |
| 10,748,873 | B2 | 8/2020 | Guo et al. | |
| 11,069,729 | B2 * | 7/2021 | Yamabi | H10F 39/805 |
| 11,444,063 | B2 * | 9/2022 | Sung | H10W 90/00 |
| 11,824,076 | B2 * | 11/2023 | Cho | H10F 39/804 |
| 12,362,344 | B2 * | 7/2025 | Kim | H10P 54/00 |
| 12,433,050 | B2 * | 9/2025 | Kim | H10F 39/804 |
| 12,471,401 | B2 * | 11/2025 | Cho | H10F 39/811 |
| 2008/0014735 | A1 * | 1/2008 | Chung | H10W 20/023 |
| | | | | 438/597 |
| 2014/0084458 | A1 * | 3/2014 | Huang | H10W 20/20 |
| | | | | 257/737 |
| 2015/0029384 | A1 * | 1/2015 | Luan | H04N 23/55 |
| | | | | 348/340 |
| 2015/0137341 | A1 * | 5/2015 | Liu | H10W 20/20 |
| | | | | 257/692 |
| 2016/0190353 | A1 * | 6/2016 | Liao | H10F 39/018 |
| | | | | 257/432 |
| 2016/0218136 | A1 * | 7/2016 | Lee | H10F 39/811 |
| 2018/0090524 | A1 * | 3/2018 | Wang | H10F 39/12 |
| 2018/0337206 | A1 * | 11/2018 | Wang | H10F 39/8057 |
| 2019/0067352 | A1 * | 2/2019 | Wang | H10F 39/8057 |
| 2019/0131228 | A1 * | 5/2019 | Chun | H10W 20/023 |
| 2019/0341409 | A1 * | 11/2019 | Yamabi | H04N 23/55 |
| 2022/0230994 | A1 * | 7/2022 | Sung | H10W 90/00 |
| 2022/0254827 | A1 * | 8/2022 | Cho | H10F 39/804 |
| 2023/0060586 | A1 * | 3/2023 | Ahn | H10W 90/00 |
| 2023/0268370 | A1 * | 8/2023 | Cho | H10F 39/811 |
| | | | | 257/686 |
| 2023/0395567 | A1 * | 12/2023 | Um | H10F 39/811 |
| 2023/0420469 | A1 * | 12/2023 | Kim | H10F 39/018 |
| 2024/0128176 | A1 * | 4/2024 | Ahn | H10W 70/685 |
| 2024/0145514 | A1 * | 5/2024 | Hur | H10F 39/807 |
| 2024/0321857 | A1 * | 9/2024 | Kim | H10P 54/00 |
| 2024/0339468 | A1 * | 10/2024 | Kim | H10F 39/804 |
| 2025/0081654 | A1 * | 3/2025 | Choi | H10F 39/809 |

FOREIGN PATENT DOCUMENTS

| | | | | | |
|---|---|---|---|---|---|
| CN | 105070734 | A | * | 11/2015 | |
| CN | 105118843 | A | * | 12/2015 | |
| CN | 105244360 | A | * | 1/2016 | |
| CN | 204991711 | U | * | 1/2016 | |
| CN | 103077951 | B | * | 3/2016 | H10F 39/811 |
| CN | 106449546 | A | * | 2/2017 | H10W 74/01 |
| CN | 104347644 | B | * | 6/2018 | H04N 23/55 |
| CN | 116632017 | A | * | 8/2023 | H10F 39/809 |
| CN | 117174720 | A | * | 12/2023 | H10W 80/00 |
| CN | 118116943 | A | * | 5/2024 | H10F 39/809 |
| DE | 102018133660 | A1 | * | 3/2020 | H10F 39/811 |
| JP | 2009206253 | A | * | 9/2009 | H10F 39/804 |
| KR | 20160090972 | A | * | 8/2016 | H10D 62/10 |
| KR | 20170140985 | A | * | 12/2017 | H10D 62/117 |
| KR | 20180040657 | A | * | 4/2018 | H01L 27/146 |
| KR | 20220007332 | A | * | 1/2022 | H10W 72/90 |
| KR | 102387948 | B1 | * | 4/2022 | H10W 20/0242 |
| KR | 10-2023-0125623 | | | 8/2023 | |
| KR | 20240000960 | A | * | 1/2024 | H10F 39/018 |
| KR | 20240113311 | A | * | 7/2024 | H10W 20/43 |
| KR | 102724720 | B1 | * | 11/2024 | H10F 39/8067 |
| KR | 102796386 | B1 | * | 4/2025 | H10W 72/90 |
| KR | 102868874 | B1 | * | 10/2025 | H10F 39/809 |
| KR | 102877798 | B1 | * | 10/2025 | H10F 39/811 |
| TW | 1437700 | B | * | 5/2014 | H10F 39/806 |
| TW | 1546910 | B | * | 8/2016 | H10W 74/137 |
| TW | 201711147 | A | * | 3/2017 | H10F 39/12 |
| WO | WO-2005022631 | A1 | * | 3/2005 | H10W 72/00 |
| WO | WO-2017036381 | A1 | * | 3/2017 | H10F 39/12 |
| WO | WO-2017036410 | A1 | * | 3/2017 | H10F 39/12 |
| WO | WO-2024090603 | A1 | * | 5/2024 | H01Q 1/325 |
| WO | WO-2024195783 | A1 | * | 9/2024 | H10F 39/12 |

* cited by examiner

FIG. 3

SEMICONDUCTOR PACKAGE INCLUDING MULTIPLE SEMICONDUCTOR CHIPS

CROSS-REFERENCE TO RELATED APPLICATION

This U.S. nonprovisional application claims priority under 35 U.S.C. § 119 to Korean Patent Application No. 10-2023-0005719, filed on Jan. 13, 2023 in the Korean Intellectual Property Office, the disclosure of which is hereby incorporated by reference in its entirety.

TECHNICAL FIELD

The present inventive concepts relate to a semiconductor package, and more particularly, to a semiconductor package including multiple semiconductor chips.

DISCUSSION OF THE RELATED ART

Semiconductor chips are generally housed within a semiconductor package prior to being used within an electronic device. An image sensor is an example of one semiconductor chip that may be housed within a semiconductor package. The image sensor is a semiconductor based sensor configured to receive light and to generate electrical signals therefrom. The image sensor is used for various electronic products such as mobile phones, digital cameras, optical mice, surveillance cameras, and biometric recognition apparatuses. The trend for compactness and multi-functionality of electronic products has caused semiconductor packages that include image sensors to be compact, highly integrated, and highly reliable.

SUMMARY

A semiconductor package includes a semiconductor chip structure and a transparent substrate disposed on the semiconductor chip structure. The semiconductor chip structure includes a first semiconductor chip and a second semiconductor chip disposed on the first semiconductor chip. The second semiconductor chip is closer to the transparent substrate than the first semiconductor chip is to the transparent substrate. The first semiconductor chip includes a semiconductor substrate that includes a first surface and a second surface opposite to the first surface, a wiring layer disposed on the first surface, and a through electrode that penetrates the semiconductor substrate and extends toward the wiring layer. The first semiconductor chip has a step structure on an edge of the semiconductor chip structure. The step structure is connected to the second surface. The step structure includes a first step, a second step, and a third step that are sequentially connected to each other. The first step includes a first bottom surface that is at a level between a level of the first surface and a level of the second surface; and a first lateral surface that connects the second surface to the first bottom surface. The second step includes a second bottom surface that is farther away from the second surface than the first bottom surface is from the second surface, and a second lateral surface that connects the first bottom surface to the second bottom surface. The third step includes a third bottom surface that is farther away from the second surface than the second bottom surface is from the second surface, and a third lateral surface that connects the second bottom surface to the third bottom surface. The through electrode extends from the second bottom surface toward the wiring layer.

A semiconductor package includes a semiconductor chip structure and a transparent substrate disposed on the semiconductor chip structure. The semiconductor chip structure includes a logic chip and an image sensor chip in contact with the logic chip. The image sensor chip is closer to the transparent substrate than the logic chip is to the transparent substrate. The logic chip includes a semiconductor substrate that includes a first surface and a second surface opposite to the first surface, a wiring layer disposed on the first surface, redistribution patterns disposed on the second surface, and through electrodes that penetrate the semiconductor substrate and extend toward the wiring layer. The logic chip has a step structure with three or more steps on an edge of the semiconductor chip structure. The step structure is recessed in a direction from the second surface toward the first surface. The step structure extends along a first direction that is parallel to the second surface. Each of the redistribution patterns includes a line part that extends along the first direction. A value equal to or greater than about 40 μm is given to a spacing distance in a second direction between the step structure and a line part of one of the redistribution patterns that is most adjacent to the step structure. The second direction intersects the first direction.

A semiconductor package includes a semiconductor chip structure, a transparent substrate disposed on the semiconductor chip structure, and a dam structure disposed between the transparent substrate and an edge of the semiconductor chip structure. The semiconductor chip structure includes a logic chip that includes first conductive pads and an image sensor chip disposed on the logic chip. The image sensor chip includes second conductive pads in contact with the first conductive pads and a microlens that is closer to the transparent substrate than the logic chip is to the transparent substrate. The logic chip includes a semiconductor substrate that includes a first surface and a second surface opposite to the first surface, a wiring layer disposed on the first surface, a through electrode that penetrates the semiconductor substrate and extends toward the wiring layer, a dielectric layer disposed on the second surface, a redistribution pattern disposed on the dielectric layer, and a connection terminal disposed on the redistribution pattern. The redistribution pattern is connected to the through electrode and the connection terminal. The logic chip has a step structure connected to the second surface on an edge of the semiconductor chip structure. The step structure includes a first step, a second step, and a third step that are sequentially connected to each other. The first step includes a first bottom surface that is at a level between a level of the first surface and a level of the second surface and a first inclined surface that connects the second surface to the first bottom surface. The second step includes a second bottom surface that is farther away from the second surface than the first bottom surface is from the second surface, and a second inclined surface that connects the first bottom surface to the second bottom surface. The third step includes a third bottom surface that is farther away from the second surface than the second bottom surface is from the second surface and a third inclined surface that connects the second bottom surface to the third bottom surface. The through electrode extends from the second bottom surface toward the wiring layer. The first inclined surface has a first height. The second inclined surface has a second height. The third inclined surface has a third height. The second height is smaller than the first height and the third height.

BRIEF DESCRIPTION OF DRAWINGS

A more complete appreciation of the present disclosure and many of the attendant aspects thereof will be readily obtained as the same becomes better understood by reference to the following detailed description when considered in connection with the accompanying drawings, wherein:

FIG. 3 is a cross-sectional view showing the arrangement of FIG. 2 in greater detail;

DETAILED DESCRIPTION OF EMBODIMENTS

Figure 1:
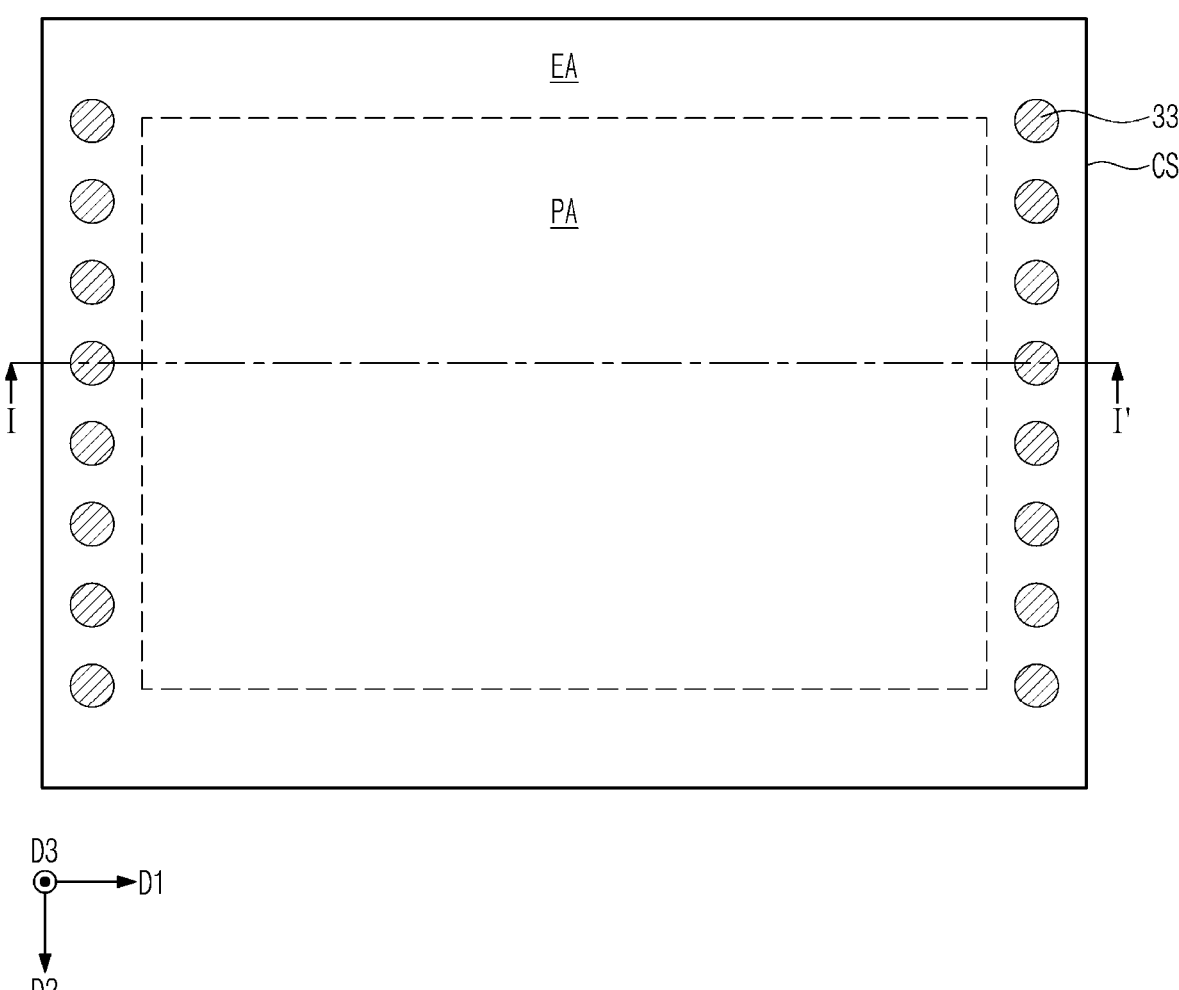
FIG. 1 is a plan view showing an image sensor according to some embodiments of the present inventive concepts.
Figure 2:
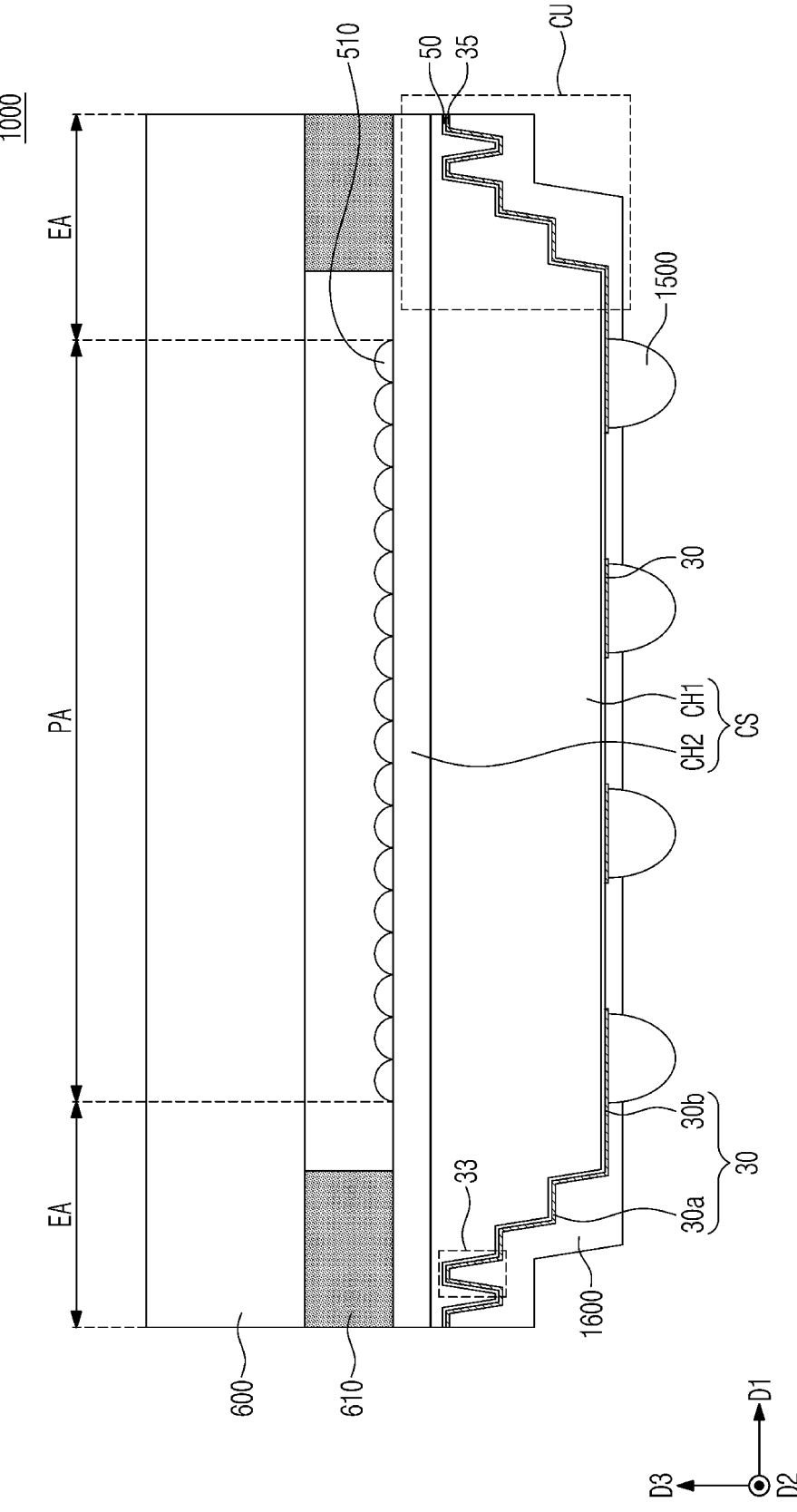
FIG. 2 is a cross-sectional view taken along line I-I' of FIG. 1.
Figure 3:
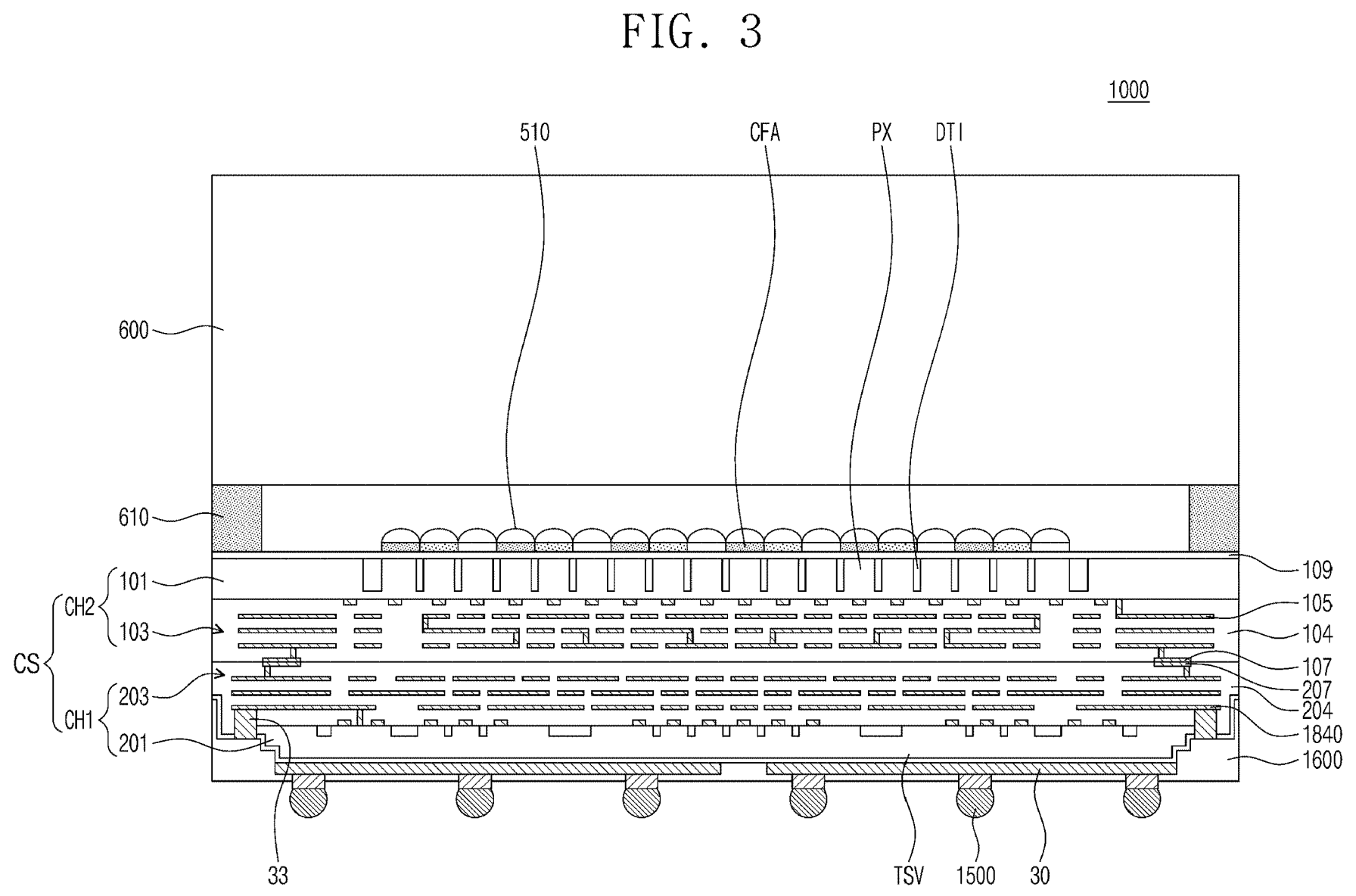
Figure 4A:
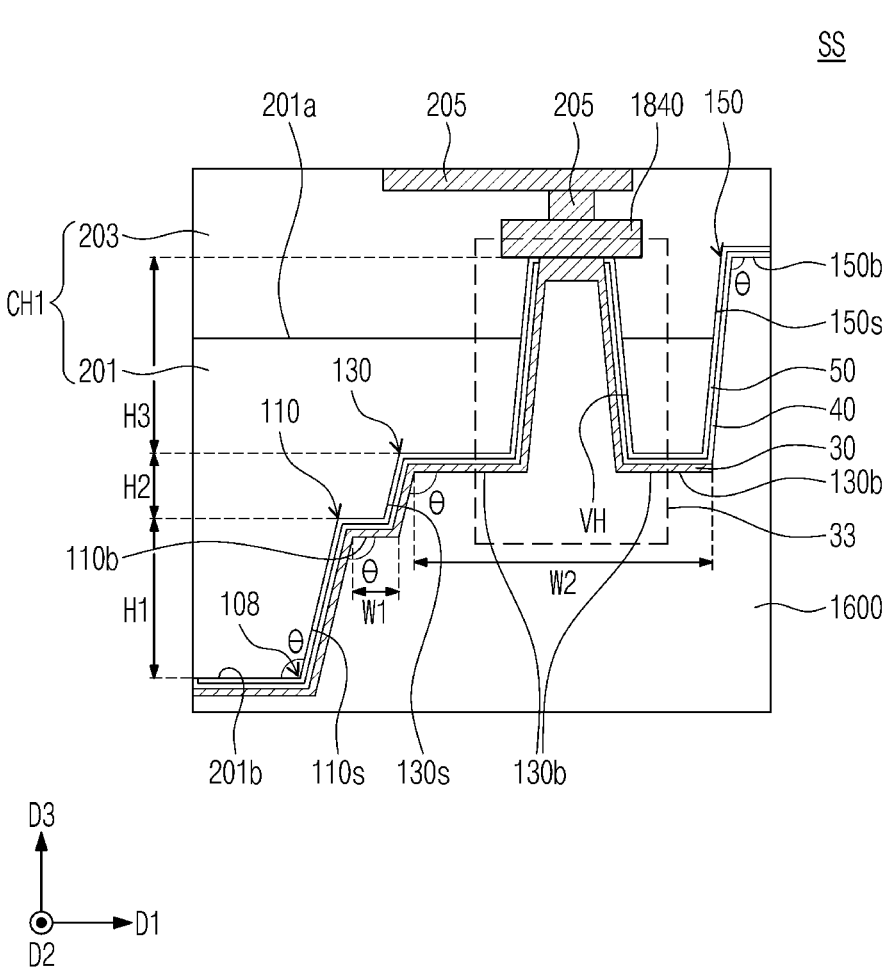
FIG. 4A is an enlarged view showing section CU of FIG. 2.
Figure 4B:
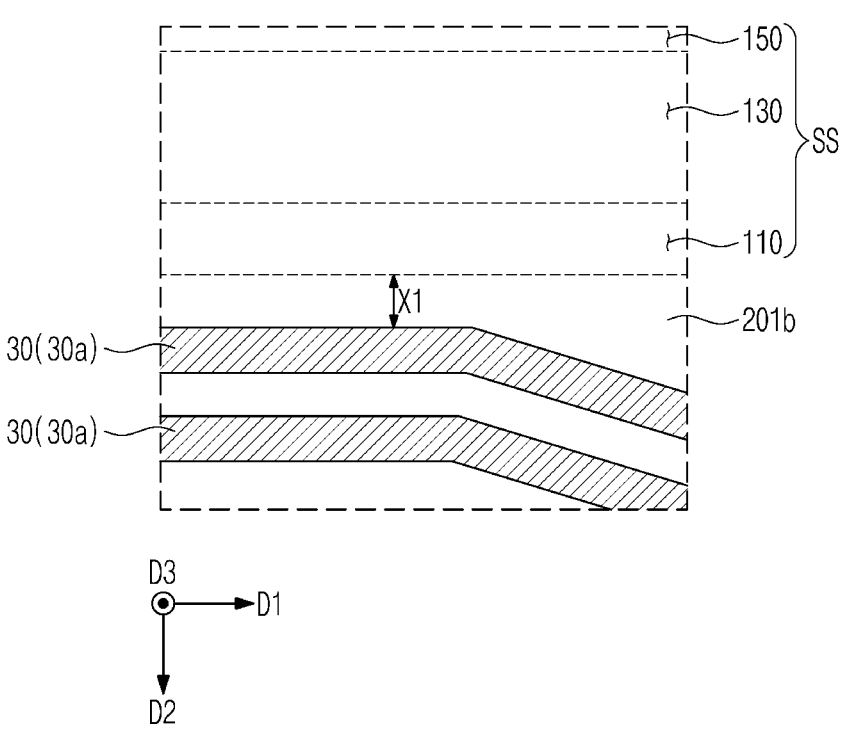
FIG. 4B is an enlarged bottom view partially showing a semiconductor package of FIG. 2.

FIG. 1 is a plan view showing an image sensor according to some embodiments of the present inventive concepts. FIG. 2 is a cross-sectional view taken along line I-I' of FIG. 1. FIG. 3 is a cross-sectional view showing the structure of FIG. 2 in greater detail. FIG. 4A is an enlarged view showing section CU of FIG. 2. FIG. 4B is an enlarged bottom view partially showing a semiconductor package of FIG. 2.

Referring to FIGS. 1 and 2, a semiconductor package 1000, according the present embodiment, may include a chip structure CS, a transparent substrate 600, and a dam structure 610.

The chip structure CS may be a semiconductor chip structure including a first semiconductor chip CH1 and a second semiconductor chip CH2. In this disclosure, the first semiconductor chip CH1 and the second semiconductor chip CH2 may be respectively called a logic chip CH1 and an image sensor chip CH2. The logic chip CH1 and the image sensor chip CH2 may be in contact with each other.

The image sensor chip CH2 may include a microlens 510 disposed on an upper portion thereof. A central region PA of the chip structure CS may indicate an area that vertically overlaps the microlens 510. An edge region EA may be defined to denote an area other than the central region PA.

The logic chip CH1 may include a dielectric layer 50 disposed on a lower portion thereof, redistribution patterns 30, through electrodes 33, a protection layer 1600, and connection terminals 1500.

The dielectric layer 50 may include a silicon oxide (SiO$_2$) layer, a silicon nitride (SiN) layer, and/or a photosensitive polyimide (PSPI) layer.

The redistribution pattern 30 may be disposed on the dielectric layer 50. The redistribution pattern 30 may include Ti, Cu, Ni, or Au. The redistribution pattern 30 may include a line part 30a and a pad part 30b. The line part 30a may extend along a first direction D1. The pad part 30b may be a portion in contact with the connection terminal 1500 and may have a width that is greater than that of the line part 30a.

The through electrodes 33 may be disposed on an edge region of the logic chip CH1. Referring to FIG. 1, in a plan view, the through electrodes 33 may be spaced apart spaced apart from each other along a second direction D2 that is orthogonal to the first direction D1. The through electrodes 33 may extend along a third direction D3 that is perpendicular to the first direction D1 and the second direction D2. Each of the through electrodes 33 may include a same metal as that of the redistribution pattern 30. The through electrode 33 may include, for example, Ti, Cu, Ni, or Au.

The protection layer 1600 may cover the dielectric layer 50, the line part 30a of the redistribution pattern 30, and the through electrode 33. The pad part 30b of the redistribution pattern 30 may be exposed from the protection layer 1600. The protection layer 1600 may include, for example, a solder resist.

The connection terminals 1500 may be disposed on the pad part 30b of the redistribution pattern 30. The connection terminals 1500 may include, for example, conductive bumps or solder balls.

The logic chip CH1 may have a step structure SS on a lower portion of the edge region EA. The step structure SS may have a stepwise shape with three or more steps. In a plan view, the through electrode 33 may vertically overlap the stepwise structure SS. The stepwise structure SS and the through electrode 33 will be further discussed in detail below.

The transparent substrate 600 may be disposed on the chip structure CS. The transparent substrate 600 may be positioned closer to the image sensor chip CH2 than to the logic chip CH1. The transparent substrate 600 may be glass or a transparent polymer material such as acryl.

The dam structure 610 may be interposed between the transparent substrate 600 and the edge region EA of the chip structure CS. The dam structure 610 may include, for example, a photosensitive adhesive polymer, a thermosetting polymer, and/or an epoxy-based mixture. The dam structure 610 may be disposed along an edge of the chip structure CS to constitute a closed curve shape. The dam structure 610 may cause the presence of an empty space between the transparent substrate 600 and the chip structure CS.

Referring to FIGS. 2 and 3, the image sensor chip CH2 may include a first semiconductor substrate 101 and a first wiring layer 103.

The first semiconductor substrate 101 may be, for example, a crystalline silicon substrate or a semiconductor layer such as a silicon epitaxial layer. The first semiconductor substrate 101 may be provided therein with a deep device isolation layer DTI that separates a plurality of pixel regions PX from each other. The deep device isolation layer DTI may have a grid shape in a plan view. The deep device isolation layer DTI may include a silicon oxide layer and/or a fixed charge layer. The deep device isolation layer DTI may further include a polysilicon pattern that is spaced apart from the first semiconductor substrate 101. The deep device isolation layer DTI may further include an air gap. A photoelectric conversion element may be disposed in the first semiconductor substrate 101 in each of the pixel regions PX that are divided by the deep device isolation layer DTI. The photoelectric conversion element may be doped with impurities whose conductivity type is different from that of impurities doped in the first semiconductor substrate 101.

A capping layer 109 may cover a top surface of the first semiconductor substrate 101. The capping layer 109 may include, for example, a silicon nitride layer. A fixed charge layer may be interposed between the capping layer 109 and the first semiconductor substrate 101. The fixed charge layer may include at least one metal oxide layer, such as an aluminum oxide layer, a tantalum oxide layer, and a hafnium oxide layer. A color filter array CFA may be disposed on the capping layer 109. A plurality of microlenses 510 may be disposed on the color filter array CFA.

The first wiring layer 103 may include a first interlayer dielectric layer 104, first wiring lines 105, and a first conductive pad 107. The first wiring layer 103 may further include gate electrodes, contact plugs, and via plugs in the first interlayer dielectric layer 104.

The first interlayer dielectric layer 104 may have a single or multiple layer including a silicon nitride layer, a silicon oxide layer, a silicon oxynitride layer, and/or a porous dielectric layer. The first wiring lines 105 may be disposed in the first interlayer dielectric layer 104. The first interlayer dielectric layer 104 may be provided therein with the first conductive pad 107 electrically connected to the first wiring lines 105. The first conductive pad 107 may contain metal, such as copper, aluminum, and tungsten. A bottom surface of the first conductive pad 107 may be coplanar with that of the first interlayer dielectric layer 104.

The logic chip CH1 may include circuits for driving the image sensor chip CH2. The logic chip CH1 may include a second semiconductor substrate 201 and a second wiring layer 203.

The second semiconductor substrate 201 may be, for example, a crystalline silicon substrate or a semiconductor layer such as a silicon epitaxial layer. The second semiconductor substrate 201 may be provided therein with a shallow device isolation layer to limit an active region.

The second wiring layer 203 may include a second interlayer dielectric layer 204, second wiring lines 205, and a second conductive pad 207. The second wiring layer 203 may further include gate electrodes, contact plugs, and via plugs in the second interlayer dielectric layer 204.

The second interlayer dielectric layer 204 may have a single or multiple layers including a silicon nitride layer, a silicon oxide layer, a silicon oxynitride layer, and/or a porous dielectric layer.

The second wiring lines 205 may be disposed in the second interlayer dielectric layer 204. The second conductive pad 207 may be electrically connected to the second wiring lines 205. The second conductive pad 207 may contain metal, such as copper, aluminum, and tungsten. A top surface of the second conductive pad 207 may be coplanar with that of the second interlayer dielectric layer 204. The first interlayer dielectric layer 104 may be in contact with the second interlayer dielectric layer 204. The first conductive pad 107 may be in contact with the second conductive pad 207. Alternatively, no interface might be present between the first conductive pad 107 and the second conductive pad 207, and the first conductive pad 107 and the second conductive pad 207 may constitute a single unitary conductive pattern.

The through electrode 33 may penetrate at least portions of the second semiconductor substrate 201 and the second interlayer dielectric layer 204, thereby being connected to one of the second wiring lines 205. The protection layer 1600 may cover a bottom surface of the second semiconductor substrate 201. The through electrode 33 may extend to penetrate an entirety of the second interlayer dielectric layer 204. In addition, the through electrode 33 may extend into the first interlayer dielectric layer 104.

The through electrode 33 might not extend into the first semiconductor substrate 101 of the image sensor chip CH2.

Referring to FIGS. 2 and 4A, the logic chip CH1 may have the step structure SS on a lower end thereof.

The second semiconductor substrate 201 may have a first surface 201a and a second surface 201b that face each other (e.g., the two surfaces may be opposite to one another). The second surface 201b may correspond to a surface in contact with the second interlayer dielectric layer 204. The step structure SS may be connected to the second surface 201b. The step structure SS may include a first step 110, a second step 130, and a third step 150 that are sequentially connected to each other.

The first step 110 may include a first bottom surface 110b located at a level between those of the first surface 201a and the second surface 201b and a first lateral surface 110s that connects the second surface 201b to the first bottom surface 110b.

The second step 130 may include a second bottom surface 130b located farther away from the second surface 201b than the first bottom surface 110b is from the second surface 201b and a second lateral surface 130s that connects the first bottom surface 110b to the second bottom surface 130b.

The third step 150 may include a third bottom surface 150b located farther away from the second surface 201b than the second bottom surface 130b is from the second surface 201b and a third lateral surface 150s that connects the second bottom surface 130b to the third bottom surface 150b.

For example, a distance may increase with increasing distance from the second surface 201b to the first bottom surface 110b, the second bottom surface 130b, and the third bottom surface 150b in the foregoing sequence. The through electrode 33 may extend from the second bottom surface 130b toward the second wiring lines 205.

The first bottom surface 110b may have a first width W1 in the first direction D1 parallel to the second surface 201b. The second bottom surface 130b may have a second width W2 in the first direction D1. The first width W1 may be less than the second width W2.

The first lateral surface 110s may be inclined with respect to the first bottom surface 110b, and may have an inclination angle θ of about 122° to about 132° with respect to the first bottom surface 110b. A degree ranging from about 122° to about 132° may also be given to an inclination angle θ between the second lateral surface 130s and the second bottom surface 130b and an inclination angle θ between the second surface 201b and the first lateral surface 110s.

One end of the through electrode 33 may be in contact with a landing pad 1840. The landing pad 1840 may be connected to the second wiring lines 205.

The first lateral surface 110s, the second lateral surface 130s, and the third lateral surface 150s may respectively have a first height H1, a second height H2, and a third height H3. The first height H1 may be a difference in level between the second surface 201b and the first bottom surface 110b. The second height H2 may be a difference in level between the first bottom surface 110b and the second bottom surface 130b. The third height H3 may be a difference in level between the second bottom surface 130b and the third bottom surface 150b. The first height H1 may be less than the third height H3. The second height H2 may be less than the first height H1.

According to the present inventive concepts, the step structure SS may have a three or more steps, and the through electrode 33 may extend toward a bottom surface of a lowermost step from a bottom surface of one next to the lowermost step. As discussed above, when the step structure SS has three steps, the through electrode 33 may extend from the second bottom surface 130b.

Referring to FIGS. 1, 2, and 4B, in a plan view, the step structure SS may be spaced apart in the second direction D2 from the second surface 201b of the second semiconductor substrate 201. The redistribution patterns 30 may be spaced apart from each other along the second direction D2 on the second surface 201b, and each of the redistribution patterns 30 may extend along the first direction D1. The step structure SS may extend along the first direction D1. A value equal to or greater than about 40 μm may be given to a spacing distance X1 between the first step 110 and its most adjacent line part 30*a* of the redistribution pattern 30.

FIGS. 5A to 5J are cross-sectional views showing a method of fabricating a semiconductor package of FIG. 2.

Figure 5A:
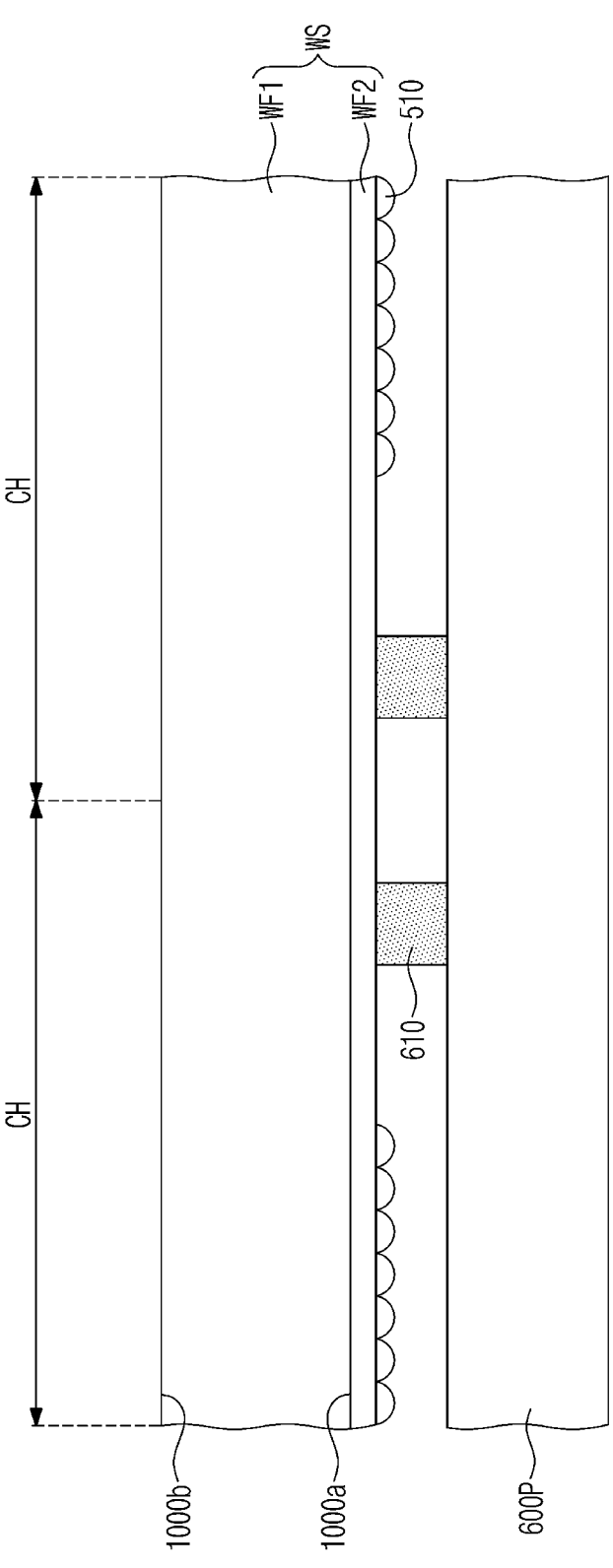
FIGS. 5A to 5J are cross-sectional views showing a method of fabricating a semiconductor package of FIG. 2.

Referring to FIG. 5A, a wafer structure WS may be attached to a preliminary transparent substrate 600P. The wafer structure WS may be attached through dam structures 610 to the preliminary transparent substrate 600P.

The wafer structure WS may include a first wafer WF1 and a second wafer WF2. The preliminary transparent substrate 600P may be glass or a transparent polymer material such as acryl.

The wafer structure WS may include chip structure parts CH. Each of the chip structure parts CH may have a structure that corresponds to that of the chip structure CS disclosed above in FIG. 2. The second wafer WF2 may include image sensor chip parts, and each of the image sensor chip parts may have a structure that is the same as that of the image sensor chip CH2 disclosed above in FIG. 2. Microlenses 510 may be disposed on the image sensor chip parts.

The first wafer WF1 may include logic chip parts. The logic chip parts may exclude a through electrode 33, a protection layer 1600, a redistribution pattern 30, a dielectric layer 40, and an connection terminal 1500 provided in the logic chip CH1 of FIG. 2, but may include a second wiring layer 203 and a second semiconductor substrate 201. As used herein, the term "exclude" may be used to mean that the elements are not present within the specified structure.

A first interlayer dielectric layer 104 included in the first wafer WF1 may be positioned in contact with a second interlayer dielectric layer 204 included in the second wafer WF2. In addition, a first conductive pad 107 included in the first wafer WF1 may be in contact with a second conductive pad 207 included in the second wafer WF2 (see FIG. 3). A thermocompression process may be performed to bond the first wafer WF1 and the second wafer WF2 to each other. The first wafer WF1 may have a first surface 1000*a* and a second surface 1000*b* that face each other (e.g., that are opposite to each other), and the second wafer WF2 may be in contact with the first surface 1000*a*.

Figure 5B:
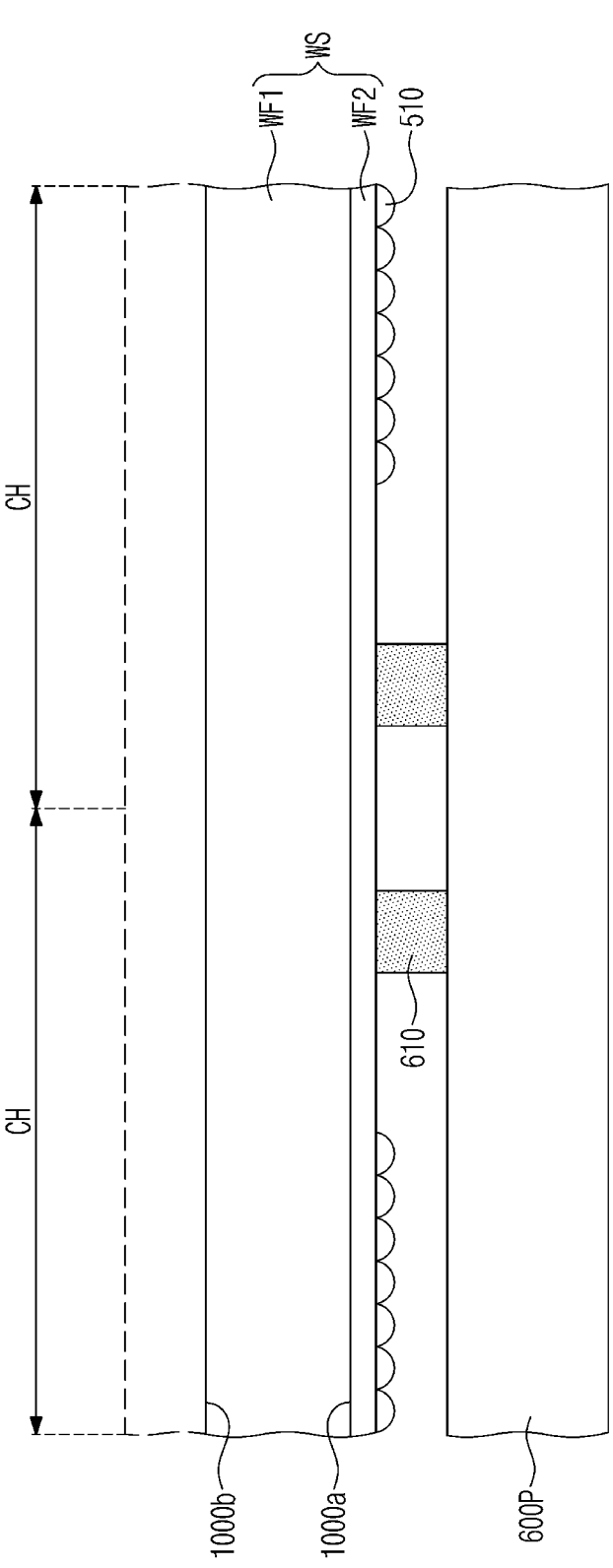

Referring to FIG. 5B, the second surface 1000*b* of the first wafer WF1 may undergo a grinding process to reduce a thickness of the first wafer WF1. The grinding process may remove a portion of the second semiconductor substrate 201 included in the first wafer WF1.

Figure 5C:
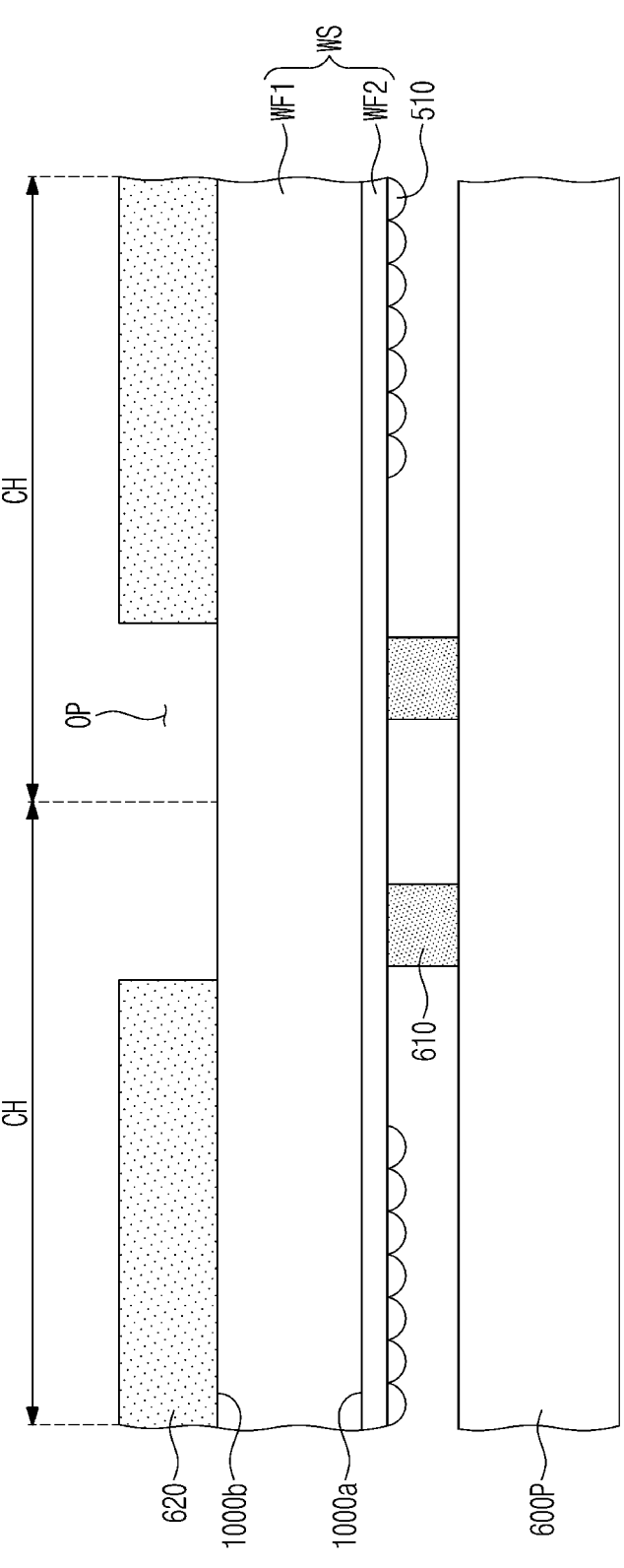

Referring to FIG. 5C, a mask pattern 620 including an opening OP may be formed on the second surface 1000*b* of the first wafer WF1. The formation of the mask pattern 620 may include forming a photoresist layer, exposing the photoresist layer, and developing the exposed photoresist layer.

Figure 5D:
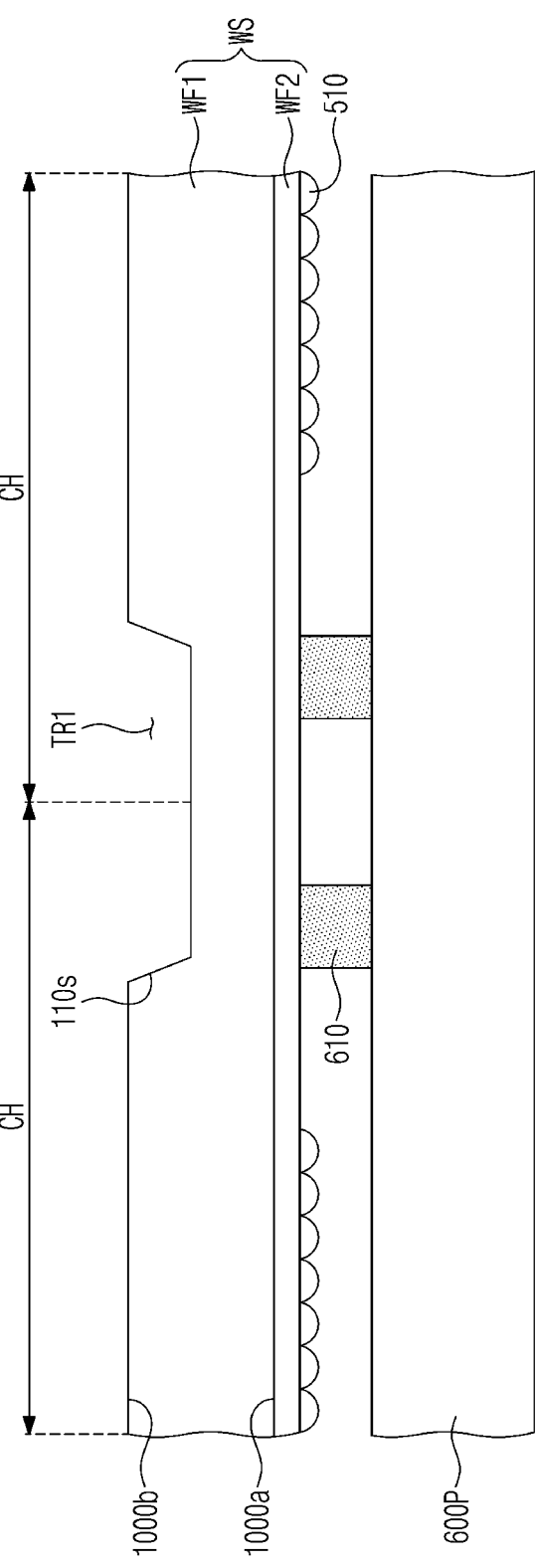

Referring to FIGS. 5C and 5D, the mask pattern 620 may be used as an etching mask to perform an etching process in which the first wafer WF1 is etched. The first wafer WF1 may have a portion exposed by the opening OP, and the etching process may remove the exposed portion of the first wafer WF1. The etching process may form a first trench TR1. The first trench TR1 may be defined by a first lateral surface 110*s* and a bottom surface of an etched portion of the first wafer WF1.

Figure 5E:
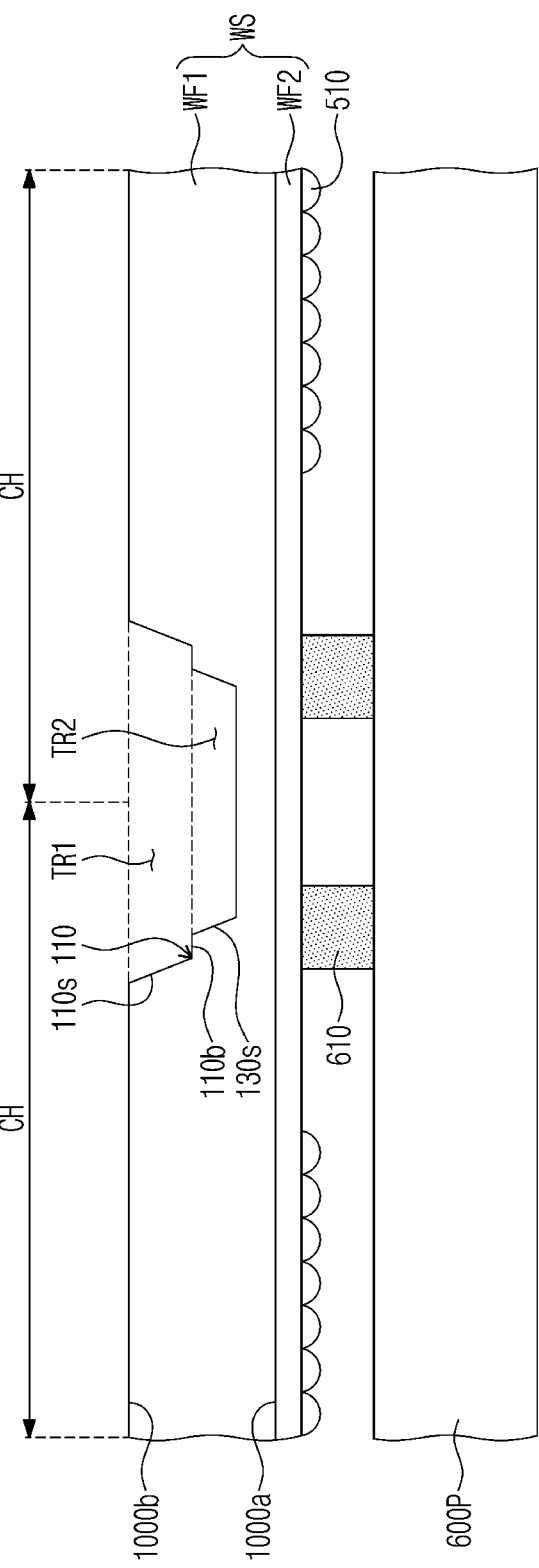

Referring to FIG. 5E, a second trench TR2 may be formed having a width that is less than that of the first trench TR1. The second trench TR2 may overlap the first trench TR1. The second trench TR2 may be formed by the same process used for forming the first trench TR1. When the second trench TR2 is formed, a first bottom surface 110*b* may also be formed to constitute a first step 110. The second trench TR2 may be defined by a second lateral surface 130*s* and a bottom surface of an etched portion of the first wafer WF1.

Figure 5F:
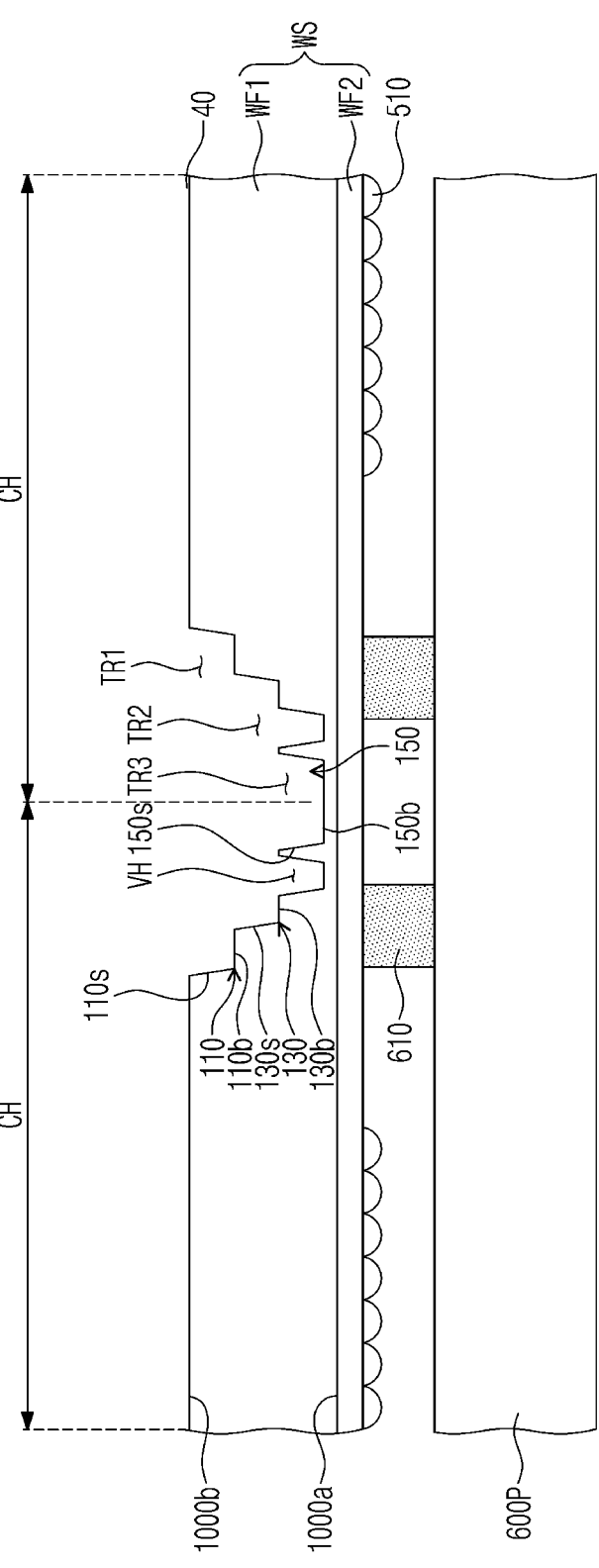

Referring to FIG. 5F, a third trench TR3 may have a width that is less than that of the second trench TR2. The third trench TR3 may be formed by the same process used for forming the first trench TR1. When the third trench TR3 is formed, a second bottom surface 130*b* may also be formed to constitute a second step 130. The third trench TR3 may be defined by a third lateral surface 150*s* and a bottom surface of an etched portion of the first wafer WF1. Afterwards, a via hole VH may be formed on the second bottom surface 130*b* to penetrate at least a portion of the first wafer WF1. The via hole VH may expose a landing pad 1840 of the second wiring layer 203. The formation of the via hole VH may constitute a third step 150.

Figure 5G:
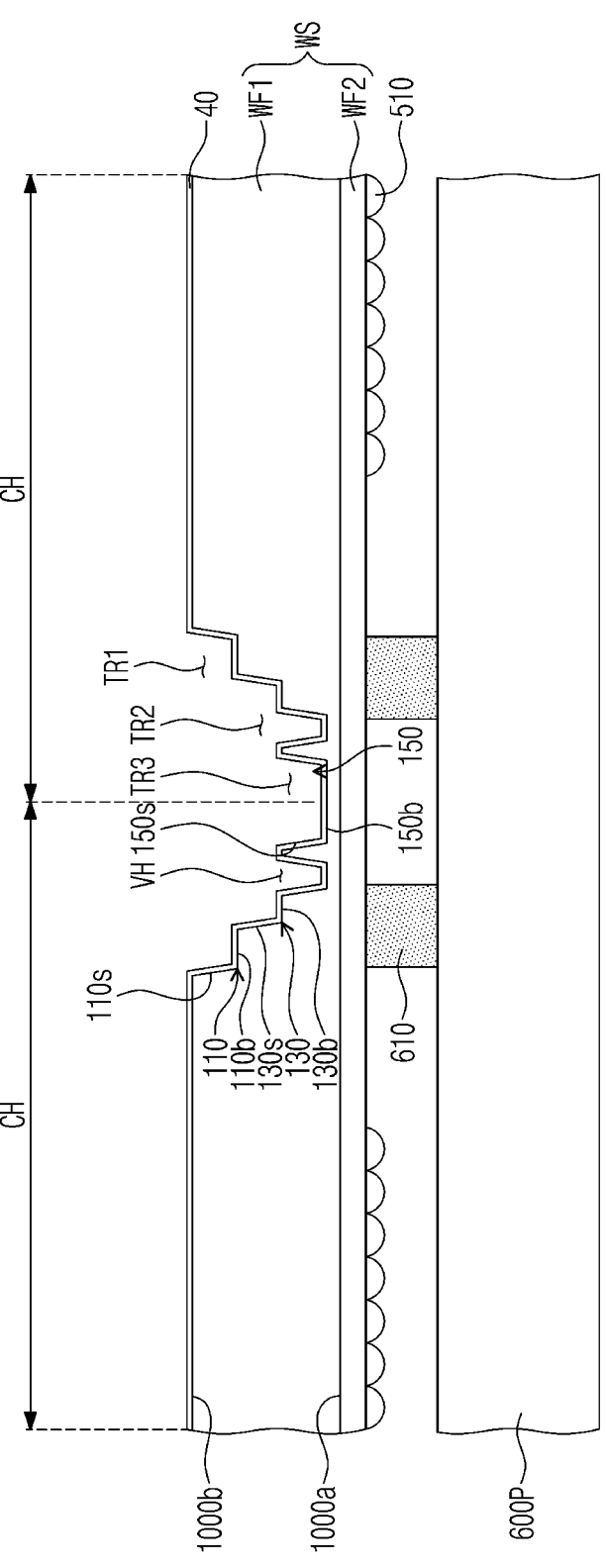

Referring to FIG. 5G, a dielectric layer 40 may be formed on the second wafer WF2. The dielectric layer 40 may fill at least a portion of the via hole VH, while covering the second surface 1000*b* of the first wafer WF1, the first step 110, the second step 130, and the third step 150.

Figure 5H:
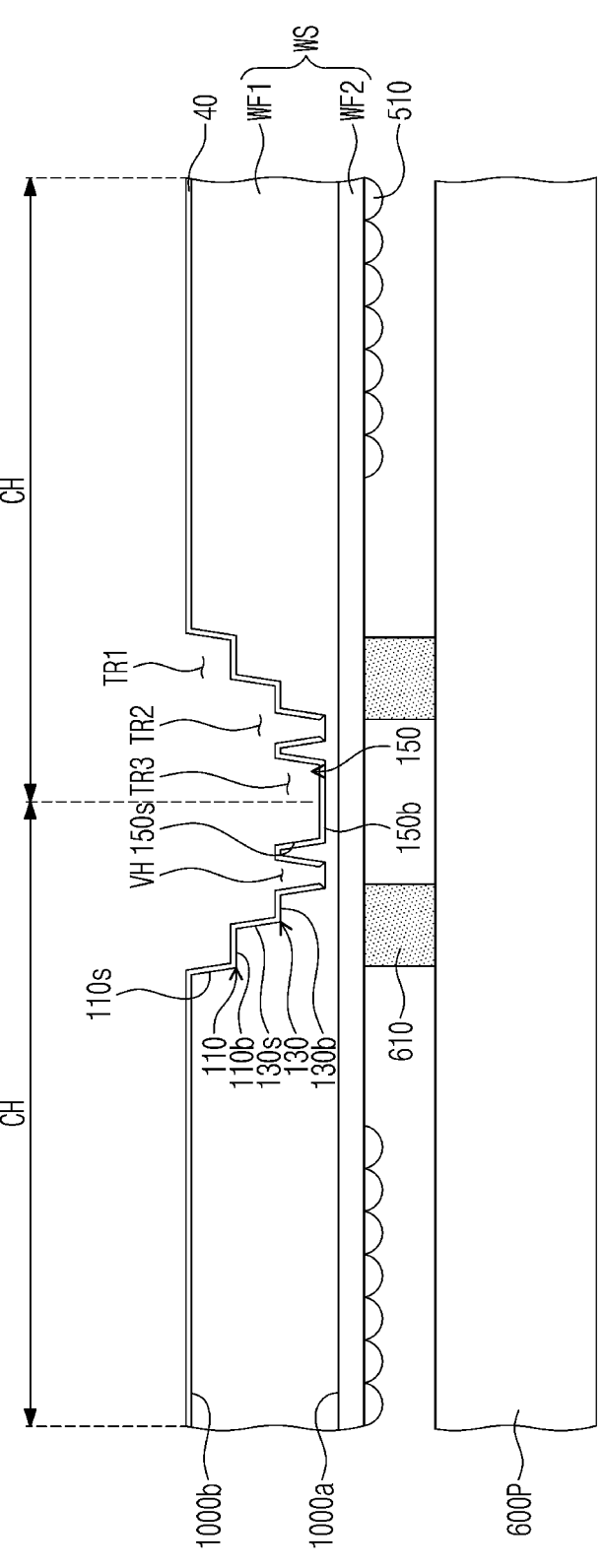

Referring to FIG. 5H, the dielectric layer 40 filling the via hole VH may be at least selectively removed. The removal of the dielectric layer 40 may include selectively etching the dielectric layer 40 formed in the via hole VH.

Figure 5I:
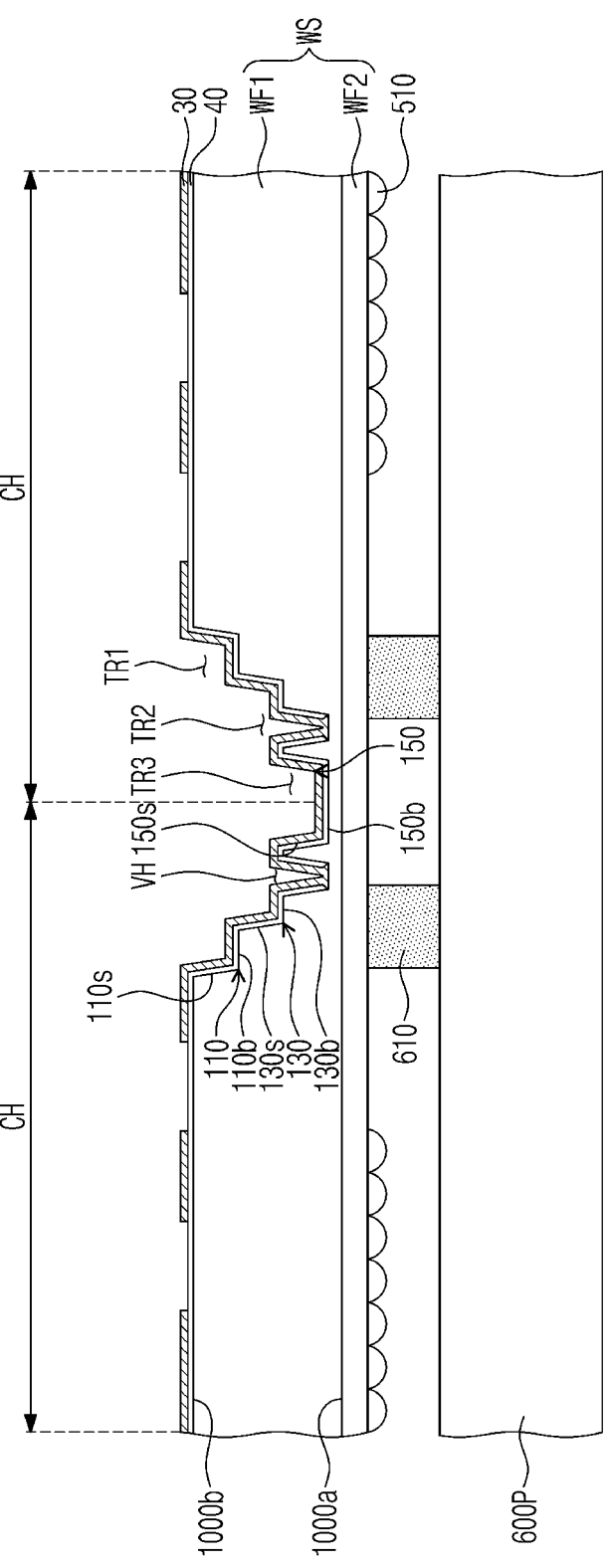

Referring to FIG. 5I, a redistribution pattern 30 and a through electrode 33 may be formed on the dielectric layer 40. The redistribution pattern 30 and the through electrode 33 may be formed simultaneously with each other. The formation of the redistribution pattern 30 and the through electrode 33 may include, on a region other than that on which the redistribution pattern 30 and the through electrode 33 will be formed, forming a photoresist pattern, forming a metal layer on an entire region, and removing (or lifting off) the photoresist pattern.

Figure 5J:
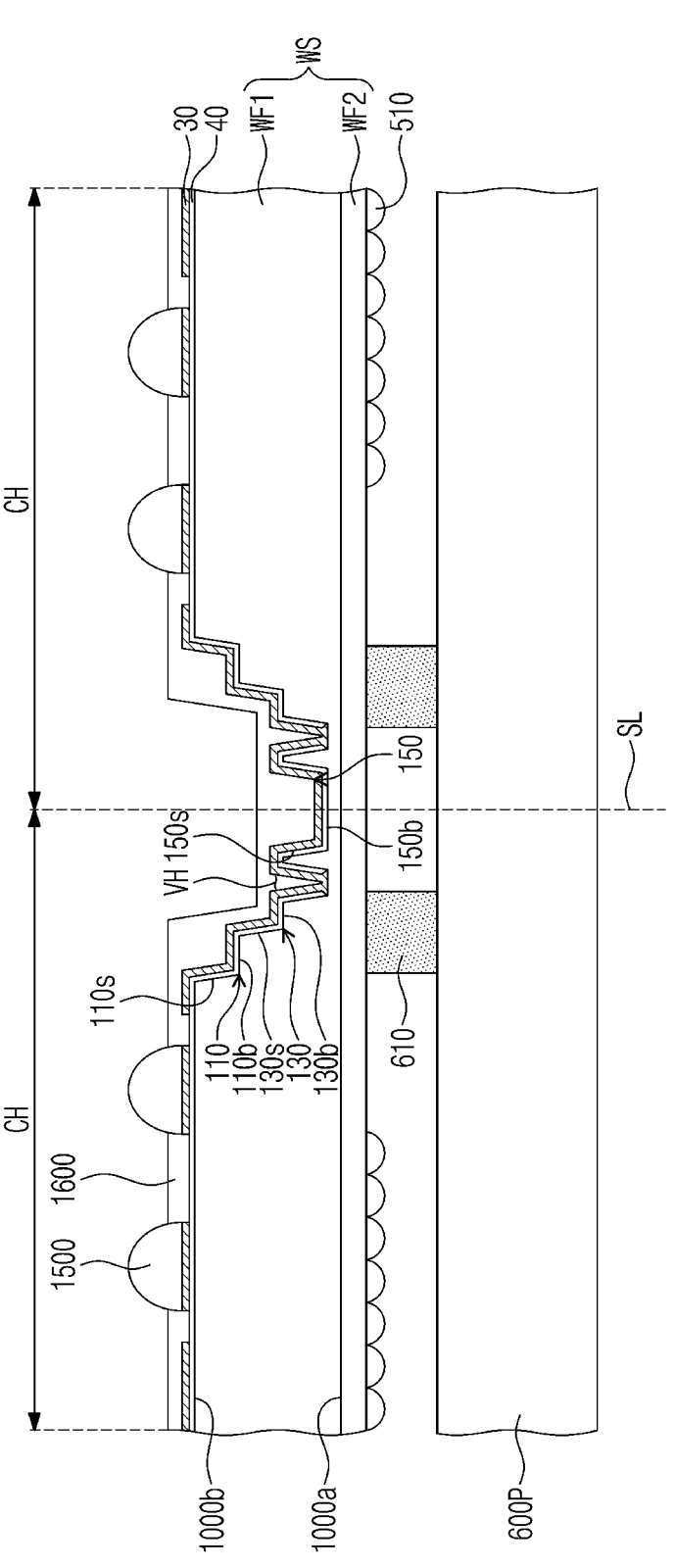

Referring to FIG. 5J, a protection layer 1600 may be formed on the redistribution pattern 30. The protection layer 1600 may cover the second surface 1000*b* of the first wafer WF1. The protection layer 1600 may be patterned to form holes that expose pads of the redistribution pattern 30. A connection terminal 1500 may be formed which is in contact with a pad part 30*b* of the redistribution pattern 30.

Referring to FIGS. 5J and 3, the wafer structure WS and the preliminary transparent substrate 600P may be diced along a sawing line SL to form chip structures CS and transparent substrates 600. As a result, it may be possible to ultimately fabricate a semiconductor package 1000 according to the present inventive concepts.

According to the present inventive concepts, even when a second semiconductor substrate has an increased thickness, a trench with three or more steps may be formed and a via hole may be formed on a bottom surface of a step next to a lowermost step. Therefore, a depth of the via hole may be adjusted so as not to be excessively large, and a diameter of the via hole may also be adjusted so as not to be extraordinarily great. In addition, a trench with three or more steps may be formed, and thus a region for redistribution patterns may be prevented from being reduced due to an increase in width of an upper trench caused by a reduction in slope of a trench sidewall.

A depth to a landing pad may increase when a trench with two steps is formed and a via hole is formed on a bottom surface of a first step or when a trench with three steps is formed and a via hole is formed on a bottom surface of a first step. Thus, a diameter of the via hole may increase to cause an increase in bottom surface of the first step. As a result, there may be a reduction in region on which a redistribution pattern will be disposed. Moreover, a region for redistribution patterns may be prevented from being reduced due to an increase in width of an upper trench caused by a reduction in slope of a trench sidewall when a trench with one or two steps is formed.

In the present inventive concepts, even when a second semiconductor substrate has an increased thickness, a through hole and a through electrode may be formed without reducing an area where a redistribution pattern is to be disposed. Accordingly, the redistribution pattern may be prevented from a limitation in routing change and a reduction in line-and-space distance.

In a semiconductor package according to some embodiments of the present inventive concepts, even when a semiconductor package has an increased thickness, a trench with three or more steps may be formed, and a via hole may be formed on a bottom surface of a step next to a lowermost step. Therefore, it may be possible to properly adjust a width of an upper trench, a depth of the via hole, and a diameter of the via hole. Accordingly, an area for redistribution patterns might not be reduced, and the redistribution patterns may be prevented from a limitation in routing change and a reduction in line-and-space distance.

Although the present inventive concepts have been described in connection with some embodiments of the present inventive concepts illustrated in the accompanying drawings, it will be understood to those skilled in the art that various changes and modifications may be made without departing from the technical spirit and features of the present disclosure. It will be apparent to those skilled in the art that various substitution, modifications, and changes may be thereto without departing from the scope and spirit of the present disclosure.

What is claimed is:

1. A semiconductor package, comprising:
a semiconductor chip structure; and
a transparent substrate disposed on the semiconductor chip structure,
wherein the semiconductor chip structure includes:
a first semiconductor chip; and
a second semiconductor chip disposed on the first semiconductor chip, the second semiconductor chip being closer to the transparent substrate than the first semiconductor chip is to the transparent substrate,
wherein the first semiconductor chip includes:
a semiconductor substrate that includes a first surface and a second surface opposite to the first surface;
a wiring layer disposed on the first surface; and
a through electrode that penetrates the semiconductor substrate and extends toward the wiring layer,
wherein the first semiconductor chip has a step structure on an edge of the semiconductor chip structure, the step structure being connected to the second surface,
wherein the step structure includes a first step, a second step, and a third step that are sequentially connected to each other,
wherein the first step includes:
a first bottom surface that is at a level between a level of the first surface and a level of the second surface; and
a first lateral surface that connects the second surface to the first bottom surface,
wherein the second step includes:
a second bottom surface that is farther away from the second surface than the first bottom surface is from the second surface; and
a second lateral surface that connects the first bottom surface to the second bottom surface, wherein the third step includes:
a third bottom surface that is farther away from the second surface than the second bottom surface is from the second surface; and
a third lateral surface that connects the second bottom surface to the third bottom surface,
wherein the through electrode extends from the second bottom surface toward the wiring layer.

2. The semiconductor package of claim 1, wherein
the first bottom surface has a first width in a first direction that is parallel to the second surface,
the second bottom surface has a second width in the first direction, and
the first width is smaller than the second width.

3. The semiconductor package of claim 1, wherein
the first lateral surface is inclined with respect to the first bottom surface,
the second lateral surface is inclined with respect to the second bottom surface, and
the third lateral surface is inclined with respect to the third bottom surface.

4. The semiconductor package of claim 3, wherein the second surface has an inclination angle of about 122° to about 132° with respect to the first lateral surface.

5. The semiconductor package of claim 3, wherein the first lateral surface has an inclination angle of about 122° to about 132° with respect to the first bottom surface.

6. The semiconductor package of claim 3, wherein the second surface has an inclination angle of about 122° to about 132° with respect to the second bottom surface.

7. The semiconductor package of claim 3, wherein the third lateral surface has an inclination angle of about 122° to about 132° with respect to the third bottom surface.

8. The semiconductor package of claim 1, wherein
the wiring layer includes a landing pad, and
the through electrode is in contact with the landing pad.

9. The semiconductor package of claim 1, wherein
the first semiconductor chip is a logic chip, and
the second semiconductor chip is an image sensor chip.

10. The semiconductor package of claim 1, wherein the first semiconductor chip further includes a redistribution pattern disposed on the second surface,
wherein the redistribution pattern is connected to the through electrode.

11. The semiconductor package of claim 1, further comprising a dam structure disposed on the edge of the semiconductor chip structure and disposed between the second semiconductor chip and the transparent substrate.

12. A semiconductor package, comprising:
a semiconductor chip structure;
a transparent substrate disposed on the semiconductor chip structure; and
a dam structure disposed between the transparent substrate and an edge of the semiconductor chip structure,
wherein the semiconductor chip structure includes:
a logic chip that includes first conductive pads; and
an image sensor chip disposed on the logic chip,
wherein the image sensor chip includes:
second conductive pads in contact with the first conductive pads; and
a microlens that is closer to the transparent substrate than the logic chip is to the transparent substrate,
wherein the logic chip includes:
a semiconductor substrate that includes a first surface and a second surface that is opposite to the first surface;
a wiring layer disposed on the first surface;

a through electrode that penetrates the semiconductor substrate and extends toward the wiring layer;

a dielectric layer disposed on the second surface;

a redistribution pattern disposed on the dielectric layer; and a connection terminal disposed on the redistribution pattern, wherein the redistribution pattern is connected to the through electrode and the connection terminal, wherein the logic chip has a step structure connected to the second surface on an edge of the semiconductor chip structure, wherein the step structure includes a first step, a second step, and a third step that are sequentially connected to each other, wherein the first step includes:

a first bottom surface that is at a level between a level of the first surface and a level of the second surface; and a first inclined surface that connects the second surface to the first bottom surface, wherein the second step includes:

a second bottom surface that is farther away from the second surface than the first bottom surface is from the second surface; and a second inclined surface that connects the first bottom surface to the second bottom surface, wherein the third step includes:

a third bottom surface that is farther away from the second surface than the second bottom surface is from the second surface; and a third inclined surface that connects the second bottom surface to the third bottom surface, wherein the through electrode extends from the second bottom surface toward the wiring layer, wherein the first inclined surface has a first height, wherein the second inclined surface has a second height, wherein the third inclined surface has a third height, and wherein the second height is less than the first height and the third height.

13. The semiconductor package of claim 12, wherein the first height is less than the third height.

14. The semiconductor package of claim 12, wherein the wiring layer includes a landing pad, and the through electrode is in contact with the landing pad.

15. The semiconductor package of claim 12, wherein the dielectric layer includes a silicon oxide ($SiO_2$) layer, a silicon nitride (SiN) layer, and a photosensitive polyimide layer.

* * * * *